United States Patent
Louvau et al.

(10) Patent No.: US 11,675,768 B2
(45) Date of Patent: Jun. 13, 2023

(54) COMPRESSION/DECOMPRESSION USING INDEX CORRELATING UNCOMPRESSED/COMPRESSED CONTENT

(71) Applicant: Microsoft Technology Licensing, LLC, Redmond, WA (US)

(72) Inventors: Scott M. Louvau, Redmond, WA (US); Michael C. Fanning, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 152 days.

(21) Appl. No.: 16/876,990

(22) Filed: May 18, 2020

(65) Prior Publication Data
US 2021/0357379 A1 Nov. 18, 2021

(51) Int. Cl.
*G06F 16/00* (2019.01)
*G06F 16/22* (2019.01)
*G06F 16/23* (2019.01)

(52) U.S. Cl.
CPC ...... *G06F 16/2272* (2019.01); *G06F 16/2365* (2019.01)

(58) Field of Classification Search
CPC .......................... G06F 16/2365; G06F 16/2272
See application file for complete search history.

(56) References Cited

U.S. PATENT DOCUMENTS

| | | | |
|---|---|---|---|
| 8,244,775 B1 | 8/2012 | Bak et al. | |
| 9,503,123 B1* | 11/2016 | Pinho | G06N 5/04 |
| 10,833,702 B1* | 11/2020 | Margalit | H03M 7/55 |
| 2006/0117061 A1 | 6/2006 | Weiss | |
| 2007/0005622 A1 | 1/2007 | Fernandes et al. | |
| 2007/0234199 A1 | 10/2007 | Astigeyevich | |
| 2009/0006450 A1 | 1/2009 | Champion et al. | |
| 2012/0133532 A1* | 5/2012 | Hunt | H03M 7/40 341/87 |
| 2012/0143927 A1 | 6/2012 | Hill et al. | |
| 2013/0298108 A1 | 11/2013 | Oliver | |
| 2015/0234841 A1 | 8/2015 | Hebert et al. | |

(Continued)

OTHER PUBLICATIONS

Hunt, James J., Kiem-Phong Vo, and Walter F. Tichy. "Delta algorithms: An empirical analysis." ACM Transactions on Software Engineering and Methodology (TOSEM) 7.2 (1998): 192-214.*

(Continued)

*Primary Examiner* — Nan Hutton
(74) *Attorney, Agent, or Firm* — Workman Nydegger

(57) ABSTRACT

Compression of data that permits direct reconstruction of arbitrary portions of the uncompressed data. Also, the direct reconstruction of arbitrary portions of the uncompressed data. Conventional compression is done such that decompression has to begin either at the very beginning of the data, or at particular intervals (e.g., at block boundaries—every 64 kilobytes) within the data. However, the principles described herein permit decompression to begin at any point within the compressed data, without having to decompress any prior portion of the file. Thus, the principles described herein permit random access of the compressed data. In accordance with the principles described herein, this is accomplished by using an index that correlates positions within the uncompressed data with positions within the compressed data.

17 Claims, 7 Drawing Sheets

(56) References Cited

U.S. PATENT DOCUMENTS

| | | | |
|---|---|---|---|
| 2019/0251189 A1* | 8/2019 | VanderSpek | G06F 16/1756 |
| 2020/0019332 A1 | 1/2020 | Danilov et al. | |
| 2021/0019093 A1 | 1/2021 | Karr et al. | |
| 2021/0406289 A1 | 12/2021 | Louvau et al. | |

OTHER PUBLICATIONS

Lakshminarasimhan, Sriram, et al. "ISABELA for effective in situ compression of scientific data." Concurrency and Computation: Practice and Experience 25.4 (2013): 524-540.*

"International Search Report and Written Opinion Issued in PCT Application No. PCT/US21/032124", dated Aug. 16, 2021, 11 Pages. (MS# 408422-WO-PCT).

"Non Final Office Action Issued in U.S. Appl. No. 16/912,386", dated Dec. 9, 2021, 22 Pages. (MS# 408422-US-NP).

"Gzip", Retrieved From: https://en.wikipedia.org/w/index.php?title=Gzip&oldid=949952083, Apr. 9, 2020, 4 Pages.

Galende, Roberto S, "Gztool", Retrieved From: https://github.com/circulosmeos/gztool/blob/d2590dea6bb5ed96ec2eb65720f2c5001c4e2c2d/README.md, Apr. 19, 2020, 15 Pages.

"International Search Report and Written Opinion Issued in PCT Application No. PCT/US21/026739", dated Jul. 19, 2021, 11 Pages. (MS# 408165-WO-PCT).

"Final Office Action issued in U.S. Appl. No. 16/912,386", dated Jul. 14, 2022, 25 Pages. (MS# 408422-US-NP).

U.S. Appl. No. 16/912,386, filed Jun. 25, 2020.

"Notice of Allowance issued in U.S. Appl. No. 16/912,386", dated Jan. 25, 2023, 8 Pages. (MS# 408422-US-NP).

\* cited by examiner

COMPRESSION/DECOMPRESSION USING INDEX CORRELATING UNCOMPRESSED/COMPRESSED CONTENT

BACKGROUND

In the information age, the ability to store and communicate data is essential. Notwithstanding, there will always be finite limits in our ability to practically store and communicate larger quantities of data. Accordingly, information that can be represented using one format in a larger number of bits (i.e., uncompressed data) is often encoded into a form that uses a fewer number of bits (i.e., compressed form) prior to storage or communication. However, it also takes some amount of time and processing power to perform compression and decompression.

Typically, compression can be accomplished by removing redundancy in the information. As an example, if a text file is being compressed, it is possible and highly likely that certain words or phrases repeatedly appear in the uncompressed text file. For example, in this very patent application, certain words will be repeated with varying degrees of frequency. Compression could involve using a word dictionary that replaces certain commonly used human-readable text sequences with smaller non-human-readable replacements. Another way is to use a combination of literal text and copy instructions in the compressed form. As an example, the LZ4 compression method compresses by replacing the text by a combination of literals and copy instructions from prior portions of the uncompressed text.

The subject matter claimed herein is not limited to embodiments that solve any disadvantages or that operate only in environments such as those described above. Rather, this background is only provided to illustrate one exemplary technology area where some embodiments describe herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The principles described herein relate to compression of data being done in a way that permits direct reconstruction of arbitrary portions of the uncompressed data. Conventional compression is done such that decompression has to begin either at the very beginning of the data, or at particular large intervals (e.g., at block boundaries—every 64 kilobytes) within the data. However, the principles described herein permit decompression to begin at any point within the compressed data, without having to decompress any prior portion of the data. Thus, the principles described herein permit rapid random access of the compressed data. In accordance with the principles described herein, this is accomplished by using an index that correlates positions within the uncompressed data with positions within the compressed data.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and details through the use of the accompanying drawings in which.

DETAILED DESCRIPTION

Figure 1:
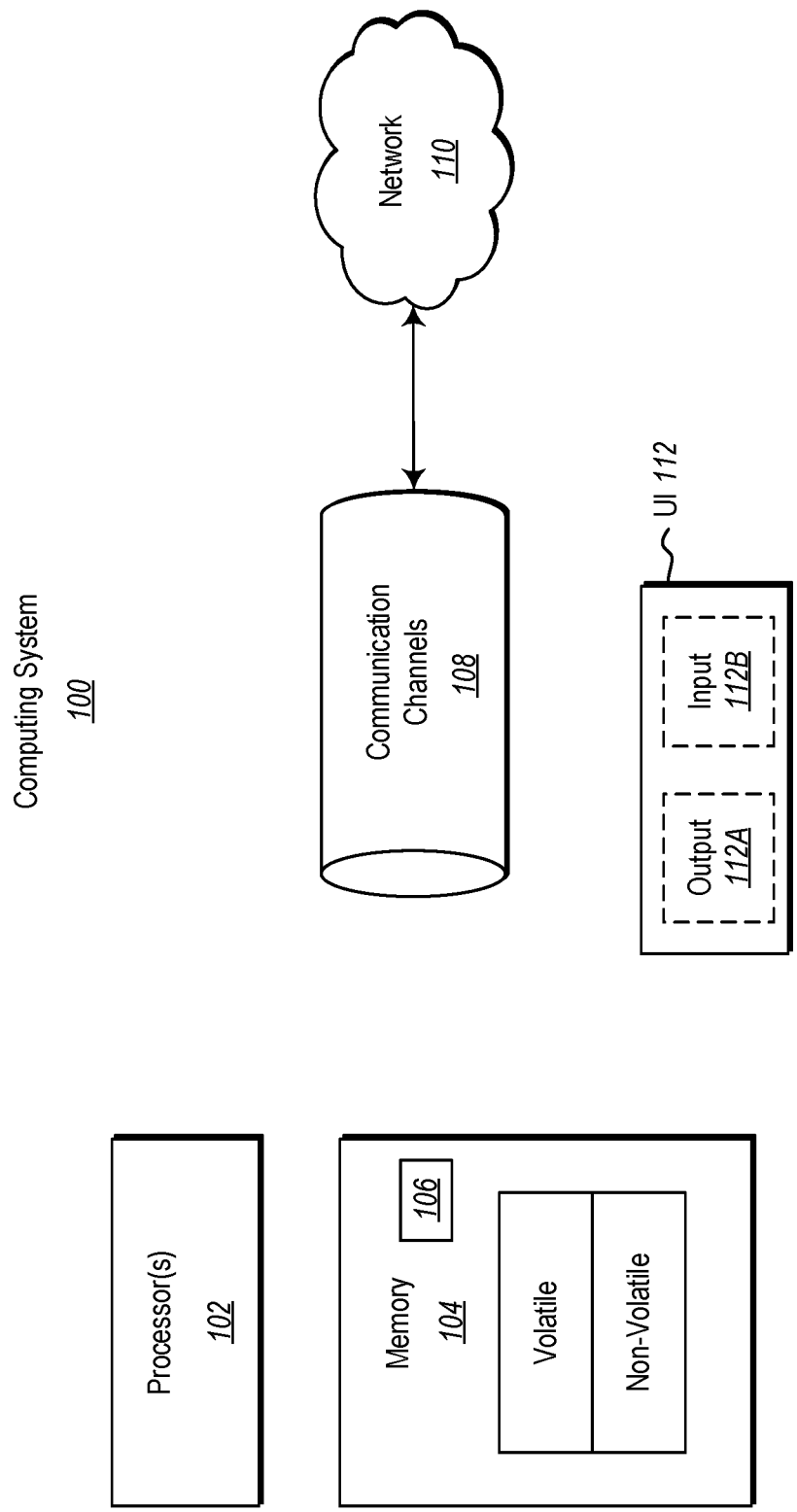
FIG. 1 illustrates an example computing system in which the principles described herein may be employed.

The principles described herein relate to compression of data being done in a way that permits direct reconstruction of arbitrary portions of the uncompressed data. Conventional compression is done such that decompression has to begin either at the very beginning of the data, or at particular large intervals (e.g., at block boundaries—every 64 kilobytes) within the data. However, the principles described herein permit decompression to begin at any point within the compressed data, without having to decompress any prior portion of the data. Thus, the principles described herein permit rapid random access of the compressed data. In accordance with the principles described herein, this is accomplished by using an index that correlates positions within the uncompressed data with positions within the compressed data.

Whatever compression technique is used, the compression tracks correlations between at least some positions in the uncompressed data and corresponding positions in the compressed data. The compression then constructs an index that records the correlation between the positions in the uncompressed data and the corresponding positions in the compressed data. An index that includes these correlations is constructed and associated with the compressed data, so that the index is available for construction of arbitrary portions of the uncompressed data from the index and from the compressed data. For example, the index could include an entry for every regular interval of bytes in the uncompressed data (e.g., for each uncompressed byte address location that is a multiple of 256).

As an example, in one embodiment, the compression occurs one compressed segment at a time, so that the compressed data includes a sequence of compressed segments. In that case, the index could include (for every so many uncompressed bytes) the identity of the compressed segment as well as the uncompressed offset within that compressed segment that represents that information (e.g., segment portion 23, 5 uncompressed bytes in).

This permits random access during decompression at any defined start position of a piece of uncompressed data to be accessed. Given that start position, the decompression uses the index to identify a corresponding position in the compressed data. The decompression then navigates to that position, and from there traverses an appropriate number of further uncompressed bytes to find the beginning of the uncompressed portion to access. The decompression then begins decompressing until an appropriate size of uncompressed portion is formed.

As an example, suppose that the uncompressed data to access is from uncompressed byte 8250 to uncompressed byte 8260 (so 11 uncompressed bytes long). Suppose further that the compressed data is formed of a sequence of compressed segments, and that there is an index entry at regular intervals of 256 uncompressed bytes. The decompression will use the index entry for uncompressed byte address 8192 to identify the compressed segment and uncompressed byte offset that corresponds to uncompressed byte address 8192. Suppose that that index entry identifies compressed segment 23 and 5 uncompressed bytes in. The decompression would obtain compressed segment 23, and traverse 63 bytes from the beginning of the compressed segment (potentially reaching into subsequent compressed segments) to reach the start position. Then, the decompression would decompress from that position for 11 more uncompressed bytes to extract the desired portion.

Because the principles described herein are performed in the context of a computing system, some introductory discussion of a computing system will be described with respect to FIG. 1. Computing systems are now increasingly taking a wide variety of forms. Computing systems may, for example, be handheld devices, appliances, laptop computers, desktop computers, mainframes, distributed computing systems, data centers, or even devices that have not conventionally been considered a computing system, such as wearables (e.g., glasses). In this description and in the claims, the term "computing system" is defined broadly as including any device or system (or a combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

As illustrated in FIG. 1, in its most basic configuration, a computing system 100 includes at least one hardware processing unit 102 and memory 104. The processing unit 102 includes a general-purpose processor. Although not required, the processing unit 102 may also include a field programmable gate array (FPGA), an application specific integrated circuit (ASIC), or any other specialized circuit. In one embodiment, the memory 104 includes a physical system memory. That physical system memory may be volatile, non-volatile, or some combination of the two. In a second embodiment, the memory is non-volatile mass storage such as physical storage media. If the computing system is distributed, the processing, memory and/or storage capability may be distributed as well.

The computing system 100 also has thereon multiple structures often referred to as an "executable component". For instance, the memory 104 of the computing system 100 is illustrated as including executable component 106. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods (and so forth) that may be executed on the computing system. Such an executable component exists in the heap of a computing system, in computer-readable storage media, or a combination.

One of ordinary skill in the art will recognize that the structure of the executable component exists on a computer-readable medium such that, when interpreted by one or more processors of a computing system (e.g., by a processor thread), the computing system is caused to perform a function. Such structure may be computer readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures, such as hard coded or hard wired logic gates, that are implemented exclusively or near-exclusively in hardware, such as within a field programmable gate array (FPGA), an application specific integrated circuit (ASIC), or any other specialized circuit. Accordingly, the term "executable component" is a term for a structure that is well understood by those of ordinary skill in the art of computing, whether implemented in software, hardware, or a combination. In this description, the terms "component", "agent", "manager", "service", "engine", "module", "virtual machine" or the like may also be used. As used in this description and in the case, these terms (whether expressed with or without a modifying clause) are also intended to be synonymous with the term "executable component", and thus also have a structure that is well understood by those of ordinary skill in the art of computing.

In the description that follows, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied on one or more computer-readable media that form a computer program product. An example of such an operation involves the manipulation of data. If such acts are implemented exclusively or near-exclusively in hardware, such as within a FPGA or an ASIC, the computer-executable instructions may be hard-coded or hard-wired logic gates. The computer-executable instructions (and the manipulated data) may be stored in the memory 104 of the computing system 100. Computing system 100 may also contain communication channels 108 that allow the computing system 100 to communicate with other computing systems over, for example, network 110.

While not all computing systems require a user interface, in some embodiments, the computing system 100 includes a user interface system 112 for use in interfacing with a user. The user interface system 112 may include output mechanisms 112A as well as input mechanisms 112B. The principles described herein are not limited to the precise output mechanisms 112A or input mechanisms 112B as such will depend on the nature of the device. However, output mechanisms 112A might include, for instance, speakers, displays, tactile output, virtual or augmented reality, holograms and so forth. Examples of input mechanisms 112B might include, for instance, microphones, touchscreens, virtual or augmented reality, holograms, cameras, keyboards, mouse or other pointer input, sensors of any type, and so forth.

Embodiments described herein may comprise or utilize a special-purpose or general-purpose computing system including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general-purpose or special-purpose computing system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: storage media and transmission media.

Computer-readable storage media includes RAM, ROM, EEPROM, CD-ROM, or other optical disk storage, magnetic disk storage, or other magnetic storage devices, or any other physical and tangible storage medium which can be used to store desired program code means in the form of computer-executable instructions or data structures and which can be accessed by a general-purpose or special-purpose computing system.

A "network" is defined as one or more data links that enable the transport of electronic data between computing systems and/or modules and/or other electronic devices. When information is transferred or provided over a network or another communications connection (either hardwired, wireless, or a combination of hardwired or wireless) to a computing system, the computing system properly views the connection as a transmission medium. Transmission media can include a network and/or data links which can be used to carry desired program code means in the form of computer-executable instructions or data structures and which can be accessed by a general-purpose or special-purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RANI within a network interface module (e.g., a "NIC"), and then be eventually transferred to computing system RANI and/or to less volatile storage media at a computing system. Thus, it should be understood that storage media can be included in computing system components that also (or even primarily) utilize transmission media.

Computer-executable instructions comprise, for example, instructions and data which, when executed at a processor, cause a general-purpose computing system, special-purpose computing system, or special-purpose processing device to perform a certain function or group of functions. Alternatively, or in addition, the computer-executable instructions may configure the computing system to perform a certain function or group of functions. The computer executable instructions may be, for example, binaries or even instructions that undergo some translation (such as compilation) before direct execution by the processors, such as intermediate format instructions such as assembly language, or even source code.

Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computing system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, datacenters, wearables (such as glasses) and the like. The invention may also be practiced in distributed system environments where local and remote computing system, which are linked (either by hardwired data links, wireless data links, or by a combination of hardwired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

For the processes and methods disclosed herein, the operations performed in the processes and methods may be implemented in differing order. Furthermore, the outlined operations are only provided as examples, an some of the operations may be optional, combined into fewer steps and operations, supplemented with further operations, or expanded into additional operations without detracting from the essence of the disclosed embodiments.

In accordance with the principles described herein, a mechanism is described that allows any arbitrary portion of uncompressed data to be accessed from compressed data. Part of this mechanism involves the way the uncompressed data is compressed, which is described by way of example with respect to FIGS. 2 through 5. Thereafter, a mechanism to access a portion of the uncompressed data from that compressed data will then be described with respect to FIGS. 6 through 7B.

Figure 2:
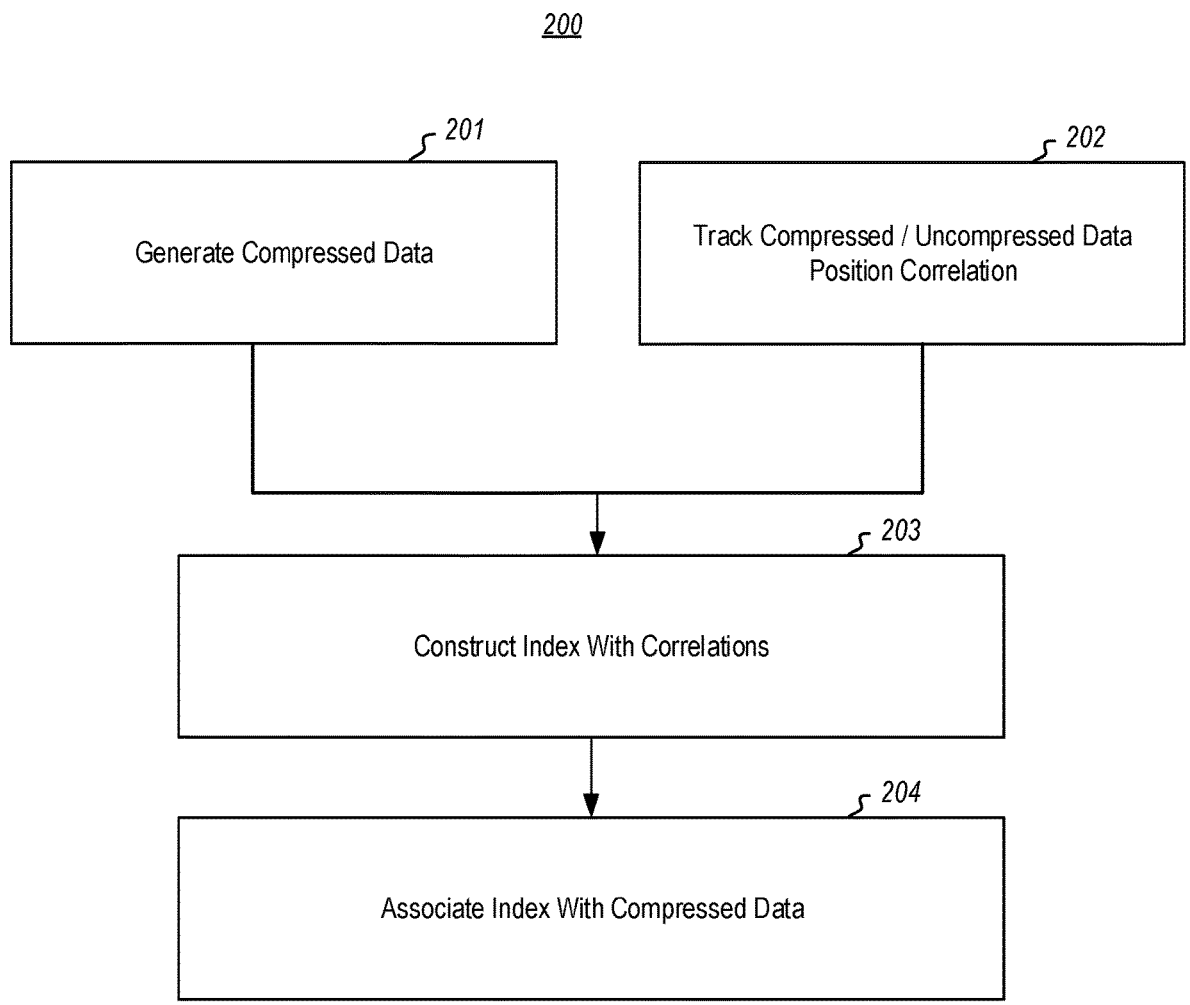
FIG. 2 illustrates a flowchart of a method for compressing so as to permit reconstruction of arbitrary portions of the uncompressed data, in accordance with the principles described herein.
Figure 3:
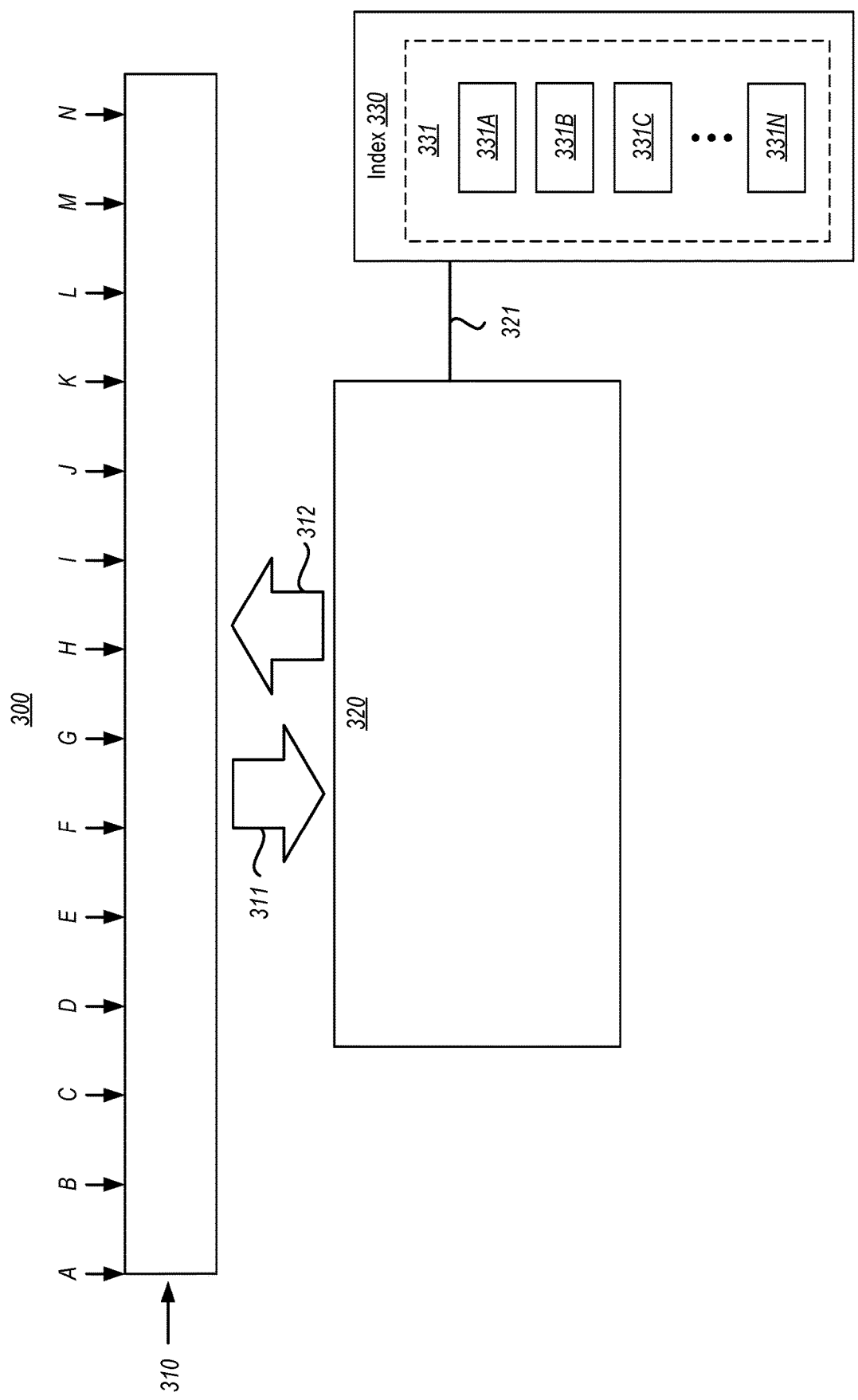
FIG. 3 illustrates an environment in which compression and decompression can occur and will be frequently referred to when describing the compression of FIG. 2.

First, compression is described. FIG. 2 illustrates a flowchart of a method 200 for compressing so as to permit reconstruction of arbitrary portions of the uncompressed data, in accordance with the principles described herein. FIG. 3 illustrates an environment 300 in which compression and decompression can occur and will be frequently be referred to when describing the compression of FIG. 2. As an example, the compression of FIG. 2 may be performed by a computing system, such as the computing system 100 of FIG. 1. In that case, the method 200 may be performed by an executable component, such as the executable component 106 of FIG. 1.

The method includes generating compressed data from uncompressed data (act 201), and while doing so, tracking correlations between at least some positions in the uncompressed data and corresponding positions in the compressed data (act 202). The compression also constructs an index that records these correlations (act 203). The compression also associates the index with the compressed data (act 204) so that the index is available during decompression. The decompression then can use the index to reconstruct arbitrary portions of the uncompressed data from the compressed data.

As an example, in FIG. 3, the uncompressed data 310 is compressed into compressed data 320. The compressed data 310 could be a file, a database, or any other data structure that is suitable for accessing arbitrary portions of the data structure. Furthermore, the compression formulates an index 330 of correlations between positions of the compressed data 310 and corresponding compressed positions.

As an example, the index 330 includes correlation entries 331 that include entries 331A through 331N that correlate respective uncompressed positions A through N within the uncompressed data 310 with corresponding compressed positions within the compressed data 320. The index 330 is associated with the compressed data 320 as represented by the line 321. Compression of the uncompressed data 310 into compressed data 320 and the associated index 330 is generally represented by arrow 311. On the other hand, decompression of arbitrary portions of the uncompressed data 310 from the compressed data 320 and associated index 330 is generally represented by arrow 312. The combination of the compressed data 320 and the index 330 fully represent content of the uncompressed data 310, albeit in compressed form.

In one example, there is a correlation for positions at fixed intervals of the uncompressed data. For example, FIG. 3 illustrates that there are several locations A through N at fixed intervals within the uncompressed data 310. In one embodiment, the fixed interval is spaced by a fixed amount that falls between $2^6$ and $2^9$ uncompressed bytes, inclusive. It is advantageous to have that fixed interval be a binary power (i.e., $2^m$ where "m" is a whole number) of uncompressed bytes. This would allow the decompression to rapidly find the appropriate entry corresponding to any uncompressed byte address within the index 330 using the most significant bits (all bits other than the m least significant bits) in the uncompressed byte address. This would also allow the decompression to rapidly find an uncompressed byte offset from the interval boundary using the m least significant bits.

In a simple example, if the interval was every 32 ($2^5$) uncompressed bytes and there were only 8 ($2^3$) intervals altogether, each uncompressed byte can be uniquely identified using a single 8-bit number. If the uncompressed byte address were binary 101001100, then the three most significant bits 101 can be used to determine that the uncompressed byte is within the sixth (101) interval (i.e., 000 would be the first interval), and is at seventh uncompressed byte (00110) uncompressed bytes in that interval (note 00000 would be the first uncompressed byte in that interval). Thus, use of intervals in binary powers assists with rapid use of the index during decompression.

In one more specific embodiment, the fixed interval is between $2^6$ and $2^9$ uncompressed bytes, inclusive. A fixed interval smaller than $2^6$ uncompressed bytes would cause the index to be a significant percentage of the uncompressed data size, thereby working against the objective of achieving a good compression ratio. As an example, if each index entry were two bytes, and the uncompressed interval was 32 (or $2^5$) uncompressed bytes, the index would be roughly 15 percent of the original data size, and that is just for the index. On the other hand, if the spacing is 1024 (or $2^{10}$) uncompressed bytes, the average number of uncompressed bytes to traverse to get to a compressed position that corresponds to the beginning of the interval (a maximum of 1024 bytes, but an average of about 512 bytes) would be large, thereby increasing latency for accessing arbitrary portions of the uncompressed data. Thus, the fixed interval is some binary power of uncompressed bytes between $2^6$ and $2^9$. It is possible that a central portion of this range $2^7$ or $2^8$ uncompressed bytes for the fixed interval may provide a sweet spot balancing compression ratio and decompression latency.

Figure 4:
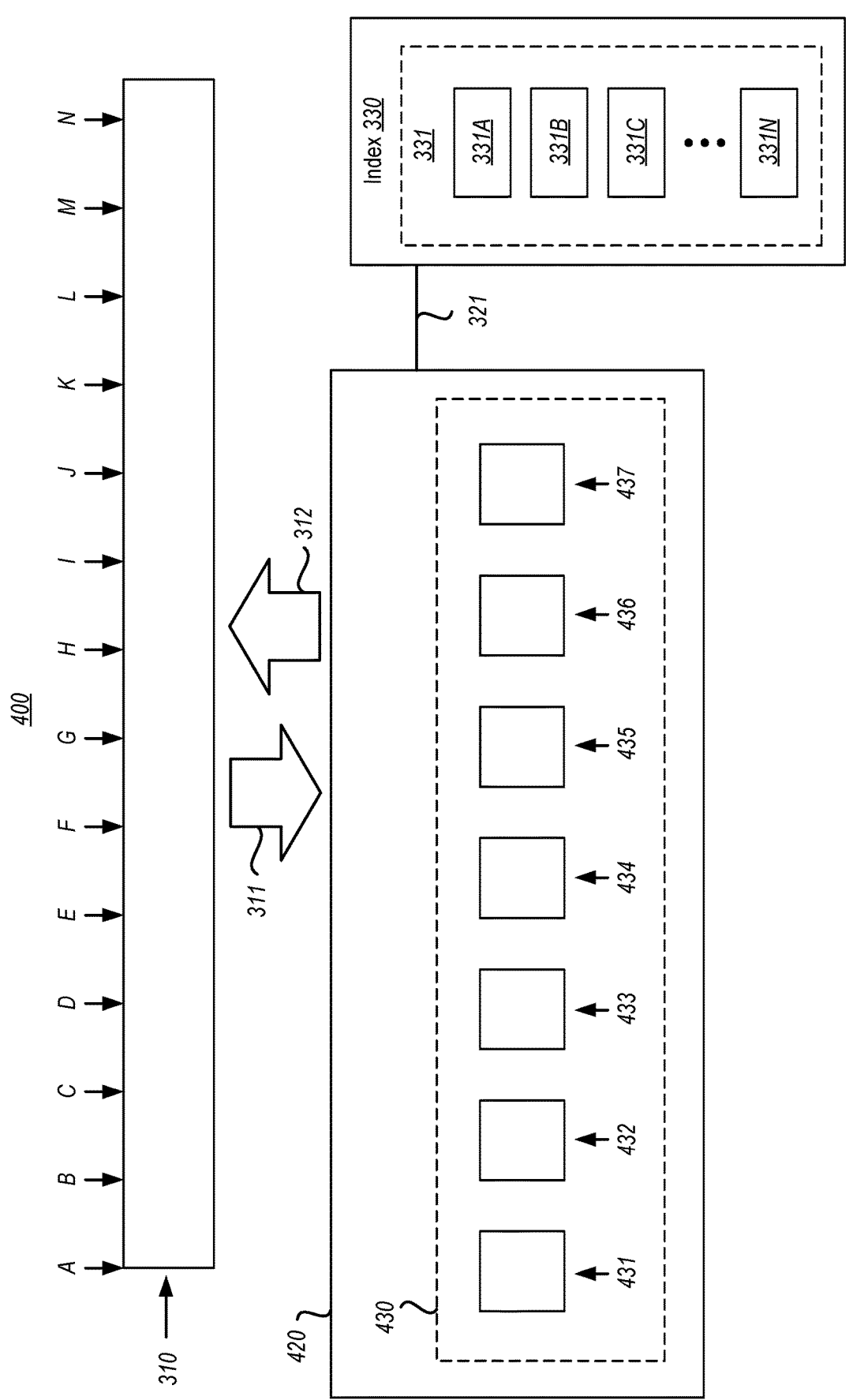
FIG. 4 shows an environment that is similar to the environment of FIG. 3, except that the compressed data is shown having multiple sequential compressed segments as an example of the compressed data.

FIG. 4 shows an environment 400 that is similar to the environment 300 of FIG. 3, except that the environment 400 shows the compressed data 420 as an example of the compressed data 320. The compressed data 420 includes a sequence 430 of compressed segments. While this sequence 430 could include any number of compressed segments, by way of illustration and example only, the sequence 430 is shown as including compressed segments 431 through 437. In such a case, each of the correlation entries 331A through 331D can include an identity of the compressed segment and an uncompressed offset. Each compressed segment compresses a range of uncompressed bytes. The uncompressed byte offset represents an uncompressed byte position within that range. As an example, a compressed segment 23 perhaps represents a compressed form of the information from uncompressed byte address 8187 to 8264. If the index entry is for uncompressed byte position 8192 (which is a multiple of 256), then the uncompressed offset would represent the fifth byte from the beginning because 8192 minus 8187 is equal to 5.

Herein, an "identity" of a compressed segment is any value that uniquely identifies a compressed segment amongst the sequence of compressed segments. As an example, that value could be an address of the beginning of the compressed segment. Thus, in this description and in the claims, an "identity" of a compressed segment is broad enough to encompass all ways to uniquely identify a compressed segment, including addresses of the compressed segment. Use of addresses as the identifier is advantageous in that once the identifier address is known, the compressed segment can be obtained without further lookup of another address.

Figure 5:
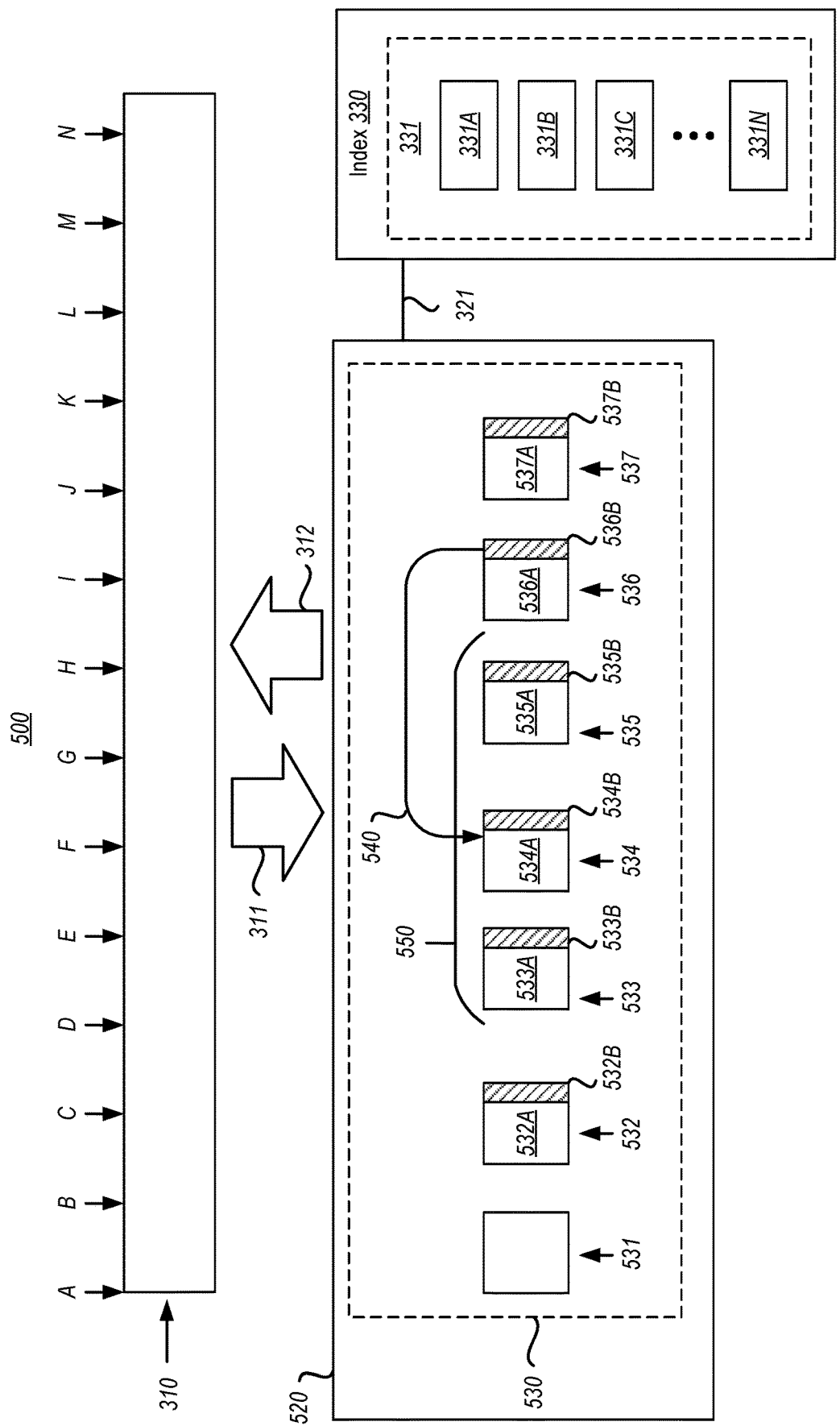
FIG. 5 illustrates an environment that is similar to the environment of FIG. 4, except that the compressed segments are illustrated as including literal parts and copy instruction parts, the copy instruction parts instructing to copy from prior or current compressed segments.

FIG. 5 illustrates an environment 500 that is similar to the environment 400 of FIG. 4, except that the environment 500 shows the compressed data 520 as an example of the compressed data 420, and the compressed segments 531 through 537 as an example of the respective compressed segments 431 through 437. In the example of FIG. 5, each of at least some of the compressed segments 531 through 537 includes a literal part (represented in FIG. 5 as the part of the compressed segments that are not filled in), and a copy instruction part (represented in FIG. 5 as the part of the compressed segments that have leftward-leaning hash marks).

The literal part includes literal uncompressed bytes of the uncompressed data. These are parts where no substantial redundant information was found to take advantage of in order to compress the data. In FIG. 5, each of the compressed segments 531 through 537 includes a literal part constituting bytes copied from the uncompressed data. For instance, compressed segment 531 is entirely a literal part, and compressed segments 532 through 537 each include a respective literal part 532A through 537A.

The copy instruction part includes instructions to copy from one or more byte ranges of one or more prior compressed segments in the sequence of compressed segments. The copy instruction part provides instructions to copy that will be followed during decompression, and includes a location within the compressed data to copy from as well as the number of bytes to copy. This copy instruction part enables compression to occur as the copy instruction is represented more compactly than the bytes that will be copied in order to decompress. In the illustrated example, the compressed segments 532 through 537 includes corresponding copy instruction parts 532B through 537B. As an example, as represented by arrow 540, the copy instruction part 536B of the compressed segment 536 includes an instruction to copy from the compressed segment 434. Thus, in the example of FIG. 5, during compression of each compressed segment one at a time, the compression looks for redundant information in the compressed data, and represents that information with an instruction to copy, rather than including all of those bytes.

An example will now be described in which the uncompressed data is text. Suppose that the following text is to be compressed.

[
  { "name": "Scott", "city": "Redmond", "lastSignedOn": "2020-05-05" },
  { "name": "Amy", "city": "Salt Lake City", "lastSignedOn": "2020-04-25" },
  ...
]

This could potentially be compressed as in the following Table 1, where each row represents a distinct compressed segment, and the left column represents literals, while the right column represents the text that is formulated by a copying from a previous compressed segment (a higher row when represented in table form), or from the literal part of the current compressed segment.

TABLE 1

| Literal | Copy |
|---|---|
| [ { "name": "Scott", "city" Redmond lastSignedOn 2020-05-05" }, Amy Salt Lake City"," ": " 4-25 | ": " ", " ": " { "name": " ", "city": " lastSignedOn 2020-0 " }, |

The copy instruction part instructs to copy from one or more previous compressed segments in the sequence of compressed segments. However, the compression ensures that the one or more prior compressed segments from which bytes can be copied are confined to be no earlier in the sequence of compressed segments than a predetermined number of bytes. For instance, this limitation in the copying is represented in FIG. 5 by bracket 550. The predetermined number of bytes may be kept low enough that the bytes may be read from the sequence 530 in a single read request, thereby enabling faster decompression. Furthermore, this allows the decompression process to be bound. As an aside, a smart compressor could improve compression ratio by putting the literal "lastSignedOn": "2020-05-05",}, earlier, so that it could later copy reusable parts of this literal.

In one embodiment, the predetermined number of bytes is a binary power (i.e., of size $2^n$ where "n" is a whole number). The lower "n" is, the less opportunity for compression, but the lower the memory needed to keep the number of bytes in order to compress and decompress. On the other hand, the higher "n" is, the more opportunity there is for compression, but the higher the memory needed to compress and decompress. If "n" is very high, it is possible that multiple read requests will be needed to access compressed data during any given reconstruction of arbitrary portions of the uncompressed data. Thus, there is a balance between compression ratio on the one hand, and on the other hand, memory usage and access latency. In one embodiment, "n" is at least ten to ensure a good compression ratio. In another embodiment, "n" is at most fifteen in order to ensure population of memory during a single read request. In yet another embodiment, "n" is a whole number between ten and fifteen, inclusive.

Although the principles described herein show each compressed segment as including at most one literal part and one copy instruction part, in some embodiments, a compressed portion can include multiple literals and copy instructions parts, or may include zero literal parts (only copy instruction part(s)) or zero copy instruction parts (only literal part(s)). However, sufficient header information is used for each part that the decompression can identify the boundary between literal parts and copy instruction parts. Thus, given the uncompressed byte address, the decompression process can still traverse the compressed segment counting uncompressed bytes that it traverses in order to find an appropriate position to begin decompression from.

Figure 6:
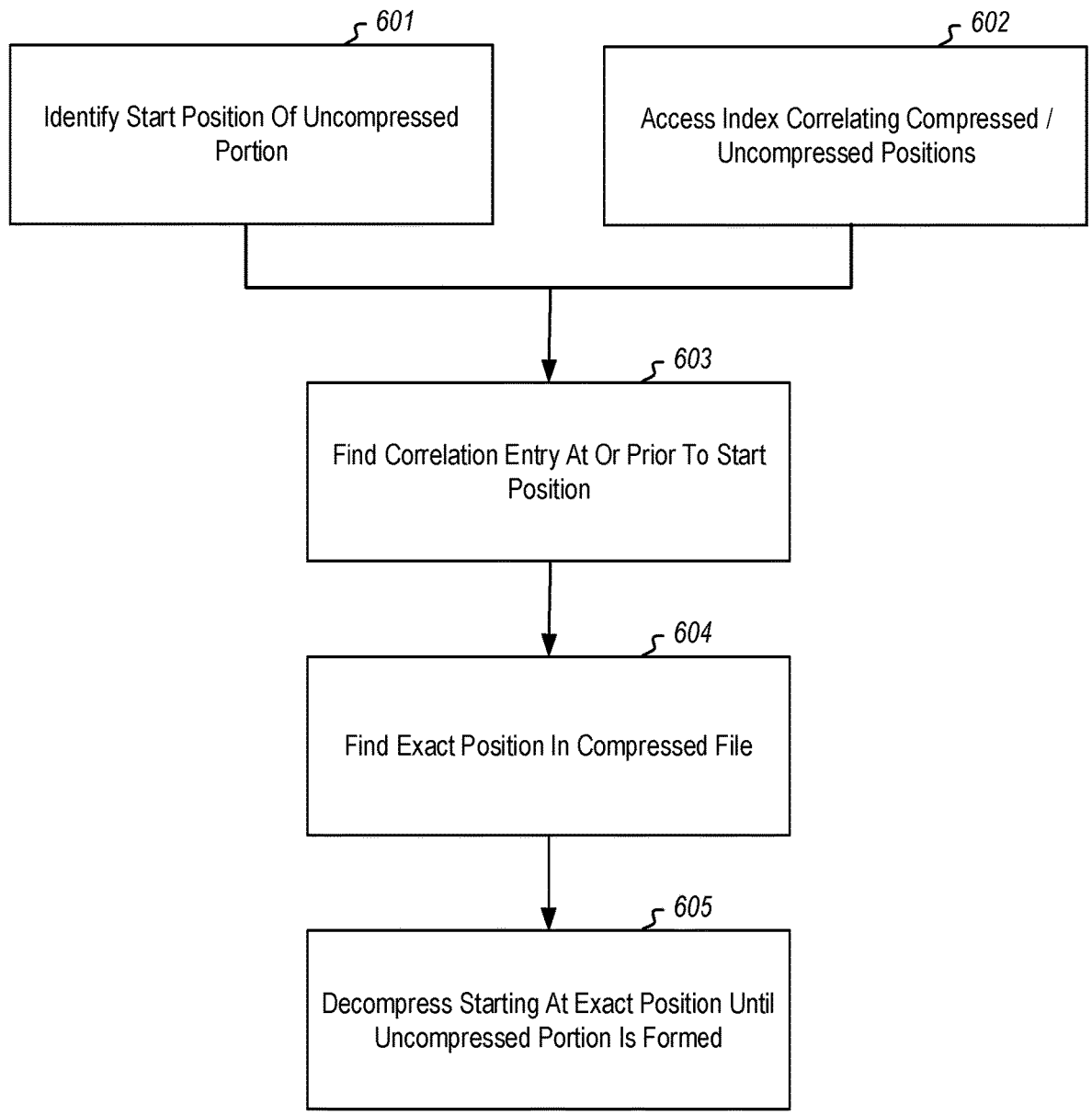
FIG. 6 illustrates a flowchart of a method for decompressing arbitrary portions of compressed data, in accordance with the principles described herein.

Now that an example compression mechanism has been described with respect to FIGS. 2 through 5, a decompression method will now be described with respect to FIG. 6. FIG. 6 illustrates a flowchart of a method 600 for decompressing arbitrary portions of compressed data, in accordance with the principles described herein. As an example, the decompression of FIG. 6 may be performed by a computing system, such as the computing system 100 of FIG. 1. In that case, the method 600 may be performed by an executable component, such as the executable component 106 of FIG. 1.

The decompression can be done starting from an identified start position of the uncompressed data. Accordingly, the method 600 begins by identifying a start position of a portion of the uncompressed data to be accessed (act 601). Rather than having this start position necessarily be at the beginning of the uncompressed data, or at the beginning of any given block, the start position can be from any byte of the uncompressed data. Thus, the identified start position can be a byte address of the uncompressed data.

The method 600 also includes accessing an index associated with the compressed data (act 602). This index correlates between locations in the compressed data and corresponding locations in the uncompressed data. In the example of FIGS. 3 through 5, this index is the index 330, which includes correlations 331A through 331N between positions A through N of the compressed data 310 and corresponding positions within the compressed data 320 for FIG. 3, compressed data 420 for FIG. 4, and compressed data 520 for FIG. 5. There is no temporal dependency between the identification of the start position (act 601) and the accessing of the index (act 602). Accordingly, acts 601 and 602 are shown in parallel.

The decompression method 600 process then finds a correlation within the index that includes a corresponding position in the uncompressed data that is prior to the identified start position of the portion of the uncompressed data to access (act 603). The decompression method 600 then uses that correlation to find an exact position in the compressed data that corresponds to the identified start position of the portion of uncompressed data to access (act 604). From there, the decompression method 600 decompresses from the found exact position until the entire portion of uncompressed data is decompressed (act 605). The end of the decompression process does not need to be at the end of the compressed data, nor at any boundary between blocks. Rather, the end of the portion of the uncompressed file that is being accessed may be any byte address. Thus, any arbitrary portion of the uncompressed data can be accessed directly from the compressed data.

This might best be illustrated by way of an example. Suppose that the index is structured to include the information in the following Table 2.

TABLE 2

| Uncompressed Byte Address | Compressed Segment ID | Uncompressed Bytes From Start To Traverse |
|---|---|---|
| 0 | 0 | 0 |
| 256 | 4 | 15 |
| 512 | 9 | 28 |
| 768 | 15 | 33 |
| 1024 | 17 | 2 |
| 1280 | 22 | 24 |
| 1536 | 26 | 16 |
| 1792 | 29 | 4 |
| 2048 | 33 | 21 |

TABLE 2-continued

| Uncompressed Byte Address | Compressed Segment ID | Uncompressed Bytes From Start To Traverse |
|---|---|---|
| 2304 | 37 | 3 |
| 2560 | 45 | 19 |
| 2816 | 47 | 6 |
| 3072 | 50 | 7 |
| 3328 | 55 | 25 |

This example includes an entry every 256 uncompressed bytes, and tells how to get to the corresponding position in the compressed portion. Specifically, to get to a particular compressed position that corresponds to the uncompressed byte address of the entry, the process would begin from the identified compressed segment and then traverse a certain number of uncompressed bytes.

First Example

In a first example, the arbitrary portion of the uncompressed data to access is 6 bytes beginning at uncompressed byte address 1806. Accordingly, the uncompressed byte address to begin decompression from is identified as uncompressed byte address 1806 (act 601). Based on this uncompressed byte address start position, the decompression then uses the index (e.g., the information from Table 2) to identify a corresponding position in the uncompressed data that is prior to the identified start position of the portion of the uncompressed data to access (act 603). In this example, uncompressed byte address 1792 is just prior to the identified start uncompressed address of 1806.

Accordingly, the entry correlating the uncompressed byte address 1792 is used to find the exact position in the compressed data that corresponds to the identified start position of uncompressed byte address 1806 (act 604). Referring to Table 1, the decompression can identify that uncompressed byte address 1792 (and thus compressed segment 29) is at or just prior to the exact position that corresponds to the identified start position (act 521) (uncompressed byte address 1806).

Furthermore, since the decompression would have to traverse 4 uncompressed bytes into the compressed segment to get to the position corresponding to uncompressed byte address 1792, and since the start position byte address 1806 is even 14 uncompressed bytes beyond that, the decompression determines to traverse 18 bytes into the compressed segment 29 to get to the exact start position of the decompression. "Traversing" uncompressed bytes in compressed data means that decompression counts the number of uncompressed bytes it encounters, but does not need to actually know what those traversed uncompressed bytes are. Thus, such traversing does not need to actually decompress anything.

To traverse through compressed segments that include copy instruction parts, the decompression process would load the predetermined number of bytes (see bracket 550 of FIG. 5) prior to the current compressed segment). From that point, the decompression would be applied to the next 6 bytes. The loaded predetermined number of bytes (see bracket 550 of FIG. 5) will also assist in decompressing should decompression involve interpreting a copy instruction part.

Figure 7A:
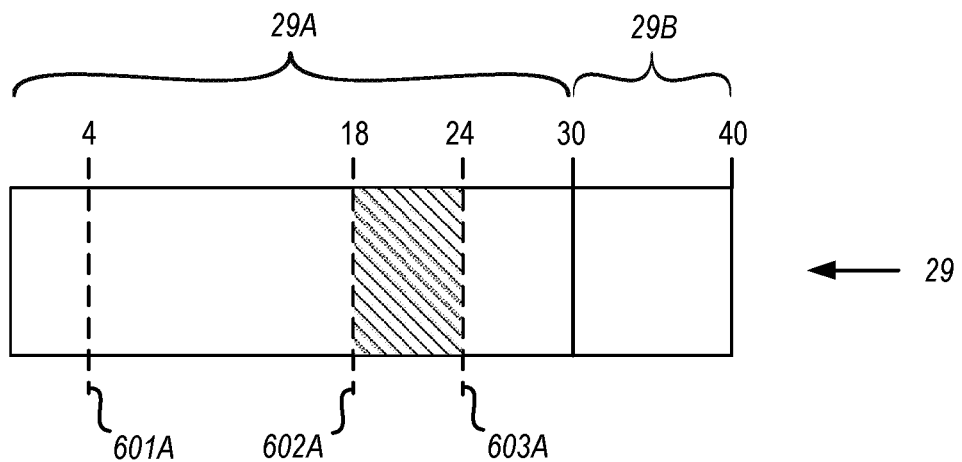
FIG. 7A illustrates an example compressed segment and is used to describe a decompression in a first example in which one arbitrary portion of the uncompressed data is accessed.
Figure 7B:
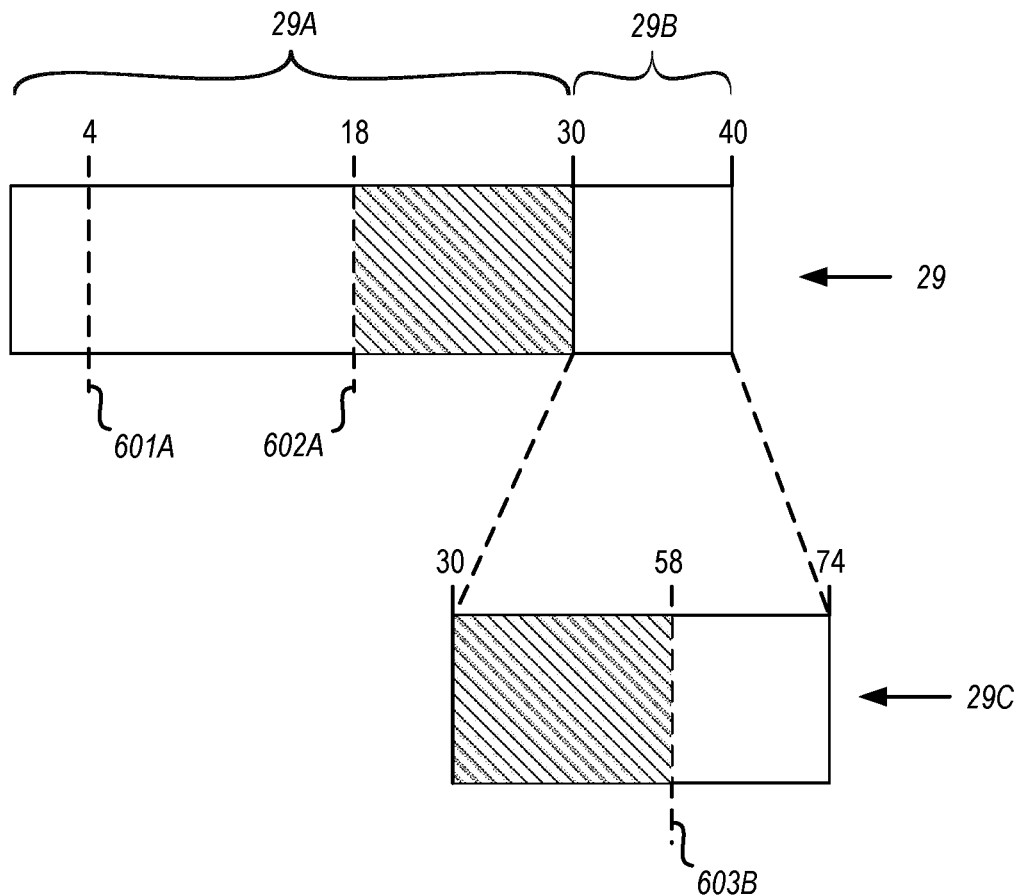
FIG. 7B illustrates an example compressed segment and is used to describe a decompression in a second example in which another arbitrary portion of the uncompressed data is accessed.

FIG. 7A illustrates an example compressed segment 29 in further detail and will be used to illustrate the first example. In this example, the compressed segment 29 includes 30 bytes of literal bytes 29A copied directly from the uncompressed data 310 during compression, as well as 10 additional bytes of copy instruction 29B (from byte 30 to byte 40). As previously described, in this example, the compressed segment has the uncompressed byte address 1792 that corresponds to information 4 bytes into compressed portion 29, which is the same as the information that is 4 bytes into the literal part 29A of the address portion, as represented by vertical line 601A. Furthermore, to get to uncompressed byte address 1806 that corresponds to information where decompression is to start from, the decompression actually traverses 18 bytes (4 bytes plus 14 bytes) into the compressed segment 29, which is the same as the information that is 18 bytes into the literal part 29A, as represented by the vertical line 602A. This vertical line (at bytes address 18 in the literal part 29A) is the exact position at which decompression is to start.

Accordingly, the decompression proceeds by copying bytes from byte 18 in the literal part 29A (from line 602A). Furthermore, since the next six bytes of information happen to all be within the literal part 29A, the decompression of the six bytes of uncompressed data involves simply copying from bytes 18 to 24 of the literal part 29A of the compressed segment 29. These bytes are represented by the region with the leftward-leaning line fills in FIG. 6A between lines 602A and 603A.

Second Example

The first example was quite simple as all of the uncompressed bytes to be randomly accessed from the compressed data happen to all have been bytes that were literally copied directly from the uncompressed data in the first place. The second example is slightly more complicated and will involve decompression by copying from the literal part 29A as well as partially following a copy instruction in a copy instruction part 29B of the compressed segment 29.

In a second example, the uncompressed byte address to begin decompression from is identified as uncompressed byte address 1806 (act 601), the same as in the first example. However, the uncompressed portion to access is now 40 uncompressed bytes long. The same as in the first example, the decompression traverses to the position 18 bytes into the compressed segment 29 to begin decompression as again represented by line 602A. Accordingly, the first 12 uncompressed bytes can be decompressed simply by copying the remainder (from byte 18 to byte 30) of the literal part 29A of the compressed segment 29.

However, 28 more uncompressed bytes still are to be decompressed from the compressed portion in order to total 40 uncompressed bytes. Accordingly, the decompression follows the copy instruction of the copy instruction part 29B. In this example, suppose that the copy instruction instructs to copy 44 bytes from a particular position of a prior compressed segment. As illustrated in FIG. 6B, the copied portion 29C represents bytes 30 to 74 that would be copied should compressed portion 29 be decompressed in its entirety (thus the 40 bytes of the compressed portion plus some headers, would decompress into 74 uncompressed bytes). However, since only 28 more uncompressed bytes are needed (ending at line 603B), the decompression only follows the copy instruction with respect to the first 28 bytes (from byte 30 to byte 58).

Third Example

In a third example, the uncompressed byte position to begin with is uncompressed byte position 1846. The decompression first seeks 54 uncompressed bytes from the uncompressed byte 1792, or in other words 58 uncompressed bytes from the beginning of the compressed segment 29. As apparent from the discussion of the second example, decompression would begin from uncompressed byte 58 found in the copied portion 29C. If ten uncompressed bytes were to be obtained, then uncompressed bytes 58 through 68 would be obtained from the copied portion 29C. If 20 uncompressed bytes were to be obtained, then all of the remaining uncompressed bytes 58 through 74 would be obtained as part of decompressing 16 of those 20 bytes, and then the first 4 bytes of the literal part of the next compressed segment 30 would then be copied to complete the extraction.

Accordingly, the principles described herein allow the ability to access any position of compressed data without having to decompress any part of the compressed data except for the portion of the compressed data that actually contains the information to be accessed in uncompressed form. Thus, the principles described herein enable random access of compressed data, opening up a completely new technical usage for compressed data.

The present invention may be embodied in other specific forms without departing from its spirit or characteristics. The described embodiments are to be considered in all respects only as illustrative and not restrictive. The scope of the invention is, therefore, indicate by the appended claims rather than by the foregoing description. All changes which come within the meaning and range of equivalency of the claims are to be embraced within their scope.

What is claimed is:

1. A computing system for compressing data so as to permit reconstruction of arbitrary portions of the uncompressed data, the computing system comprising:
   one or more processors; and
   one or more computer-readable media having thereon computer-executable instructions that are structured such that, when executed by the one or more processors, cause the computing system to perform the following:
      generating a compressed data structure from the uncompressed data, wherein the compressed data structure comprises a sequence of compressed segments where at least some of the sequence of compressed portions include a literal part and a copy instruction part, wherein the literal part includes literal uncompressed bytes of the uncompressed data, and the copy instruction part includes instructions to copy a specified byte range of prior compressed segments in the sequence of compressed segments;
      while generating the compressed data structure, tracking correlations between at least some positions in the uncompressed data and corresponding positions in the compressed data structure;
      constructing an index that records the correlations between the at least some positions in the uncompressed data and the corresponding positions in the uncompressed data, wherein the correlations within the index for at least some positions in the uncompressed data include an identity of the compressed segment and an uncompressed offset; and
      associating the index with the compressed data structure so that the index is available for reconstruction of arbitrary portions of the uncompressed data from the index and compressed data structure.

2. The computing system in accordance with claim 1, the index having correlations for positions at fixed intervals of the uncompressed data.

3. The computing system in accordance with claim 2, the fixed intervals being spaced by a fixed amount that falls between $2^6$ and $2^9$ uncompressed bytes, inclusive.

4. The computing system in accordance with claim 1, the predetermined number of bytes being of size $2^n$ bytes, where n is a whole number no greater than fifteen.

5. The computing system in accordance with claim 1, the predetermined number of bytes being of size $2^n$ bytes, where n is a whole number that is at least ten.

6. The computing system in accordance with claim 5, the predetermined number of bytes being of size $2^n$ bytes, where n is a whole number from ten to fifteen, inclusive.

7. A method for compression so as to permit construction of arbitrary portions of uncompressed data, the method comprising:
generating a compressed data structure from the uncompressed data, wherein the compressed data structure comprises a sequence of compressed segments where at least some of the sequence of compressed portions include a literal part and a copy instruction part, wherein the literal part includes literal uncompressed bytes of the uncompressed data, and the copy instruction part includes instructions to copy a specified byte range of prior compressed segments in the sequence of compressed segments;
while generating the compressed data structure, tracking correlations between at least some positions in the uncompressed data and corresponding positions in the compressed data structure;
constructing an index that records the correlations between the at least some positions in the uncompressed data and the corresponding positions in the uncompressed data, wherein the correlations within the index for at least some positions in the uncompressed data include an identity of the compressed segment and an uncompressed offset; and
associating the index with the compressed data structure so that the index is available for reconstruction of arbitrary portions of the uncompressed data from the index and compressed data structure.

8. The method in accordance with claim 7, the uncompressed data being a database.

9. The method in accordance with claim 7, the uncompressed data being a file.

10. The method in accordance with claim 7, the compressed data structure comprising a sequence of compressed segments, the correlations within the index including, for each of the at least some positions in the uncompressed data, the following: an identity of the compressed segment and an uncompressed offset, such that the correlations can be used to find the respective position of the uncompressed data by navigating to the uncompressed offset in an uncompressed form of the compressed segment.

11. A computing system for decompressing arbitrary positions of a compressed data structure, the computing system comprising:
one or more processors; and
one or more computer-readable media comprising computer-executable instructions that are structured such that, when executed by the one or more processors, cause the computing system to perform the following:
identifying a start position of the portion of uncompressed data to access from the compressed data structure;
accessing an index associated with the compressed data structure, the index recording correlations between at least some positions in the uncompressed data and the corresponding positions in the uncompressed data, wherein the correlations within the index for at least some positions in the uncompressed data include an identity of the compressed segment and an uncompressed offset;
finding a correlation within the index that includes a corresponding position in the uncompressed data that is prior to the identified start position of the portion of the uncompressed data to access;
using the correlation to find an exact position in the compressed data structure that corresponds to the identified start position of the portion of uncompressed data to access; and
decompressing the compressed data structure from the found exact position until the entire portion of uncompressed data is decompressed, wherein the compressed data structure comprises a sequence of compressed segments where at least some of the sequence of compressed portions include a literal part and a copy instruction part, wherein the literal part that includes literal uncompressed bytes of the uncompressed data, and the copy instruction part includes instructions to copy a specified byte range of prior compressed segments in the sequence of compressed segments.

12. The computing system in accordance with claim 11, the index having correlations for positions at fixed intervals of the uncompressed data, the fixed intervals being spaced by a fixed amount that falls between $2^6$ and $2^9$ uncompressed bytes, inclusive.

13. The computing system in accordance with claim 12, the compressed data structure comprising a sequence of compressed segments, the correlations within the index including, for each of the at least some positions in the uncompressed data, the following: an identity of the compressed segment and an uncompressed offset.

14. The computing system in accordance with claim 12, the finding of the exact position using the found correlation comprising:
identifying a compressed segment that is at or prior to the exact position;
determining how many uncompressed bytes to traverse from the beginning of the compressed segment to arrive at the exact start position; and
traversing uncompressed bytes from the beginning of the compressed segment to arrive at the exact start position.

15. The computing system in accordance with claim 14, the exact start position being in a compressed segment that is after the identified compressed segment in the sequence of compressed segments.

16. The computing system in accordance with claim 14, traversing uncompressed bytes in any given compressed segment in the sequence of compressed segments being performed using redundant information from within a predetermined number of compressed bytes prior the given compressed segment.

17. The computing system in accordance with claim 16, the predetermined number of compressed bytes being of size $2^n$ bytes, where n is a whole number from ten to fifteen, inclusive.

* * * * *